United States Patent [19]

Krilic

[11] Patent Number: 4,789,964

[45] Date of Patent: Dec. 6, 1988

[54] OPTOELECTRONIC DYNAMIC RANDOM ACCESS MEMORY SYSTEM

[76] Inventor: Goran Krilic, Pljesivicka 48, 41040 Zagreb, Yugoslavia

[21] Appl. No.: 870,515

[22] Filed: Jun. 4, 1986

[30] Foreign Application Priority Data

Dec. 19, 1985 [GB] United Kingdom .................. 8531347

[51] Int. Cl.[4] ............................................. G11C 11/42
[52] U.S. Cl. ....................................... 365/115; 365/222
[58] Field of Search ........................ 365/115, 120, 222; 357/19, 29, 30

[56] References Cited

U.S. PATENT DOCUMENTS 3,860,915  1/1975  Geier et al. .......................... 365/115

*Primary Examiner*—James W. Moffitt
*Attorney, Agent, or Firm*—Lee & Smith

[57] ABSTRACT

A memory device employing optoelectronic elements which in combination form a dynamic RAM, the elements comprising first and second photodiodes electrically connected for exchange of a reverse bias condition from one photodiode to the other when either one is exposed to light to cause a photocurrent to flow, thereby to define logical '0' and '1' states, and an optical switch such as a MOS structure connected in parallel with one of the photodiodes so as to be rendered light transmissive in only one of the reverse bias conditions, thereby to detect the logical state of the cell when exposed to incident light.

10 Claims, 11 Drawing Sheets

OPTOELECTRONIC DYNAMIC RANDOM ACCESS MEMORY SYSTEM

FIELD OF THE INVENTION

This invention relates to an optoelectronic dynamic random access memory device and apparatus (OE DRAM).

BACKGROUND OF THE INVENTION

Dynamic RAMs wherein data is capacitatively stored and in consequence periodic refreshing is required are in themselves well known. Conventional DRAMs are of purely electrical fabrication and refreshing presents a problem in relation to writing into or reading from the memory, since complex circuitry such as arbiter is necessary to separate the functions.

OBJECT OF THE INVENTION

It is an object of this invention to provide a dynamic RAM which comprises optoelectronic elements so arranged that, without the use of additional circuitry, refreshing can be performed simultaneously with a write or read operation and be completely independent thereof.

It is a further object of the invention to provide such an OE DRAM in which reading is non-destructive and therefore access time is equal to cycle time. In this respect the OE DRAM is similar to a static RAM, but a still further object of the invention is to provide an OE DRAM in which power dissipation or reading is less than in a static RAM, this being enabled by minimisation of the number of elements rendered active during memory access.

THE INVENTION

According to one aspect of the invention, there is provided an optoelectronic dynamic random access memory device having a plurality of memory cells, each memory cell comprising a reversely biassed first photodiode, a second photodiode so connected electrically with the first photodiode as to become subject to an increasing reverse bias when the first photodiode is optically addressed to cause photocurrent to flow at said first photodiode to reduce the reverse bias of said first photodiode, whereupon when the second photodiode is optically addressed a flow of photocurrent at the second photodiode will decrease the reverse bias at the second diode and permit restoration of reverse bias at the first photodiode, thereby to define logical '0' and '1' states dependently on the reversals of reverse bias, and an optical switch electrically connected in circuit with at least one of said first and second photodiodes and which when optically read passes light principally in only one of the '0' and '1' states defined by the first and second photodiodes, the memory cell being optically refreshable in one of the two states without precluding reading by cyclically causing a light to pass at the optical switch and thereby by means of an optical coupling with at least one of the first and second photodiodes to restore reverse bias lost at the second photodiode due to decay. In a practical embodiment, in each memory cell the first photodiode is reversely biassed at one of its electrodes and the other electrode of said first photodiode is connected to the corresponding first electrode of the second photodiode, said second photodiode being earthed at its other electrode, and the optical switch is connected in parallel with one of said first and second photodiodes.

The optical switch may be one of a PN structure or MOS structure where light is applied perpendicularly to the surface without waveguiding. Alternatively but less preferably, the optical switch may be a Ga-Al-As PIN junction light-waveguide modulator. Refreshing is preferably effected by directing light on to the optical switch in the logical '1' condition so that light emanating from the optical switch is incident on at least the first photodiode.

In a preferred arrangement, the OE DRAM device has a plurality of memory cells each comprising a reversely biassed first photodiode; an earthed second photodiode electrically connected to the first photodiode firstly to become reversely biassed when photocurrent flows at the first photodiode and secondly to permit restoration of reverse bias at the first photodiode when photocurrent flows at the second photodiode; means for optically addressing the photodiodes to cause switching between logical '0' and '1' states dependently on the conditions of reverse bias; an optical switch electrically connected in parallel with one of the first and second photodiodes, said optical switch permitting passage of light in one of the '0' and '1' states to enable optical reading; and means supporting the photodiodes and the optical switch to optically couple said optical switch and at least one of the said photodiodes thereby to enable refreshing in one of the '0' and '1' states by permitting light to pass through the optical switch to be incident on at least the first photodiode. While the term "passage" of light is employed in relation to the optical switch, it will be understood that the passage will in general not be direct, and that the light emanating from the optical switch is not necessarily the same light, or even light of the same wavelength, as that initially incident on the optical switch.

According to a further aspect of the invention, there is provided optoelectronic dynamic random access memory apparatus comprising:

a plurality of memory cells, each memory cell comprising first and second photodiodes and an optical switch;

means for reversely biassing the first photodiode, the second photodiode being connected to the first photodiode for exchanging conditions of reverse bias therewith when photocurrent flows at one of said first and second photodiodes;

means for optically addressing the first and second photodiodes to write a '0' or '1' logical state dependently on the condition of reverse bias;

an optical switch electrically connected to at least one of the first and second photodiodes;

means for optically reading the memory cell by directing light on to the optical switch, which principally transmits light in only one of the '0' and '1' states;

a photodetector;

means supporting the photodiodes, optical switch and photodetector so that light for reading the memory cell and passed through the optical switch is at least principally incident on the photodetector and does not energise the photodiodes.

The apparatus preferably includes means for refreshing the memory cell in one of the '0' and '1' states by directing light on to the optical switch for passage of light which is incident on at least the first photodiode and does not energise the photodetector.

An electronic receiver may be connected to be responsive to the outputs of the photodetectors associated with the memory cells of a column thereof, whilst at least one and desirably both of the functions of writing into and reading the memory cells is performed by an x,y addressable LED array.

DESCRIPTION OF EMBODIMENTS

Figure 1A:
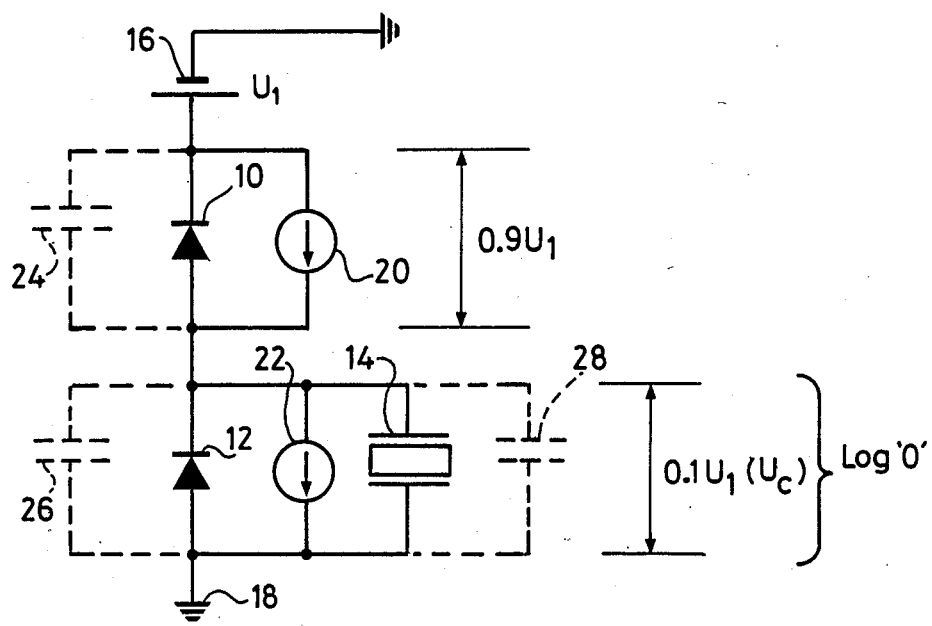
FIGS. 1A and 1B show a memory cell in the logical '0' condition.

Referring to FIG. 1A, a memory cell in accordance with the invention comprises a first photodiode (PIN 1) referenced 10 and a second photodiode (PIN 2) referenced 12, together with an optical switch 14. The photodiode 10 is reverse biassed at its negative electrode from a biassing source 16 and is connected at its positive electrode to the negative electrode of the second photodiode 12, which is connected to earth 18 at its positive electrode. The optical switch 14 is connected in parallel with the second photodiode 12. The Figure also shows the circuit paths which include the current generators 20, 22 producing the dark current which flows at PIN 1 and of the combined dark current of PIN 2 and the reverse current of the optical switch in the absence of incident light, and in broken line at 24, 26.

Under the conditions shown in FIG. 1 (logical '0'), a voltage of about $0.9U_1$ exists across the first photodiode 10 and about $0.1U_1$ across the second photodiode 12, where $U_1$ is the voltage of the biassing source 16.

Figure 2:
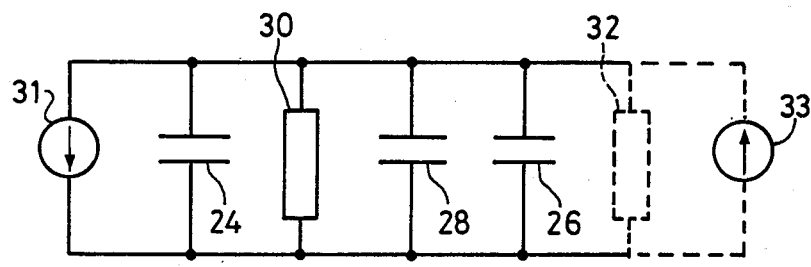
FIG. 2 shows the equivalent electrical circuit of the memory cell.
Figure 1B:
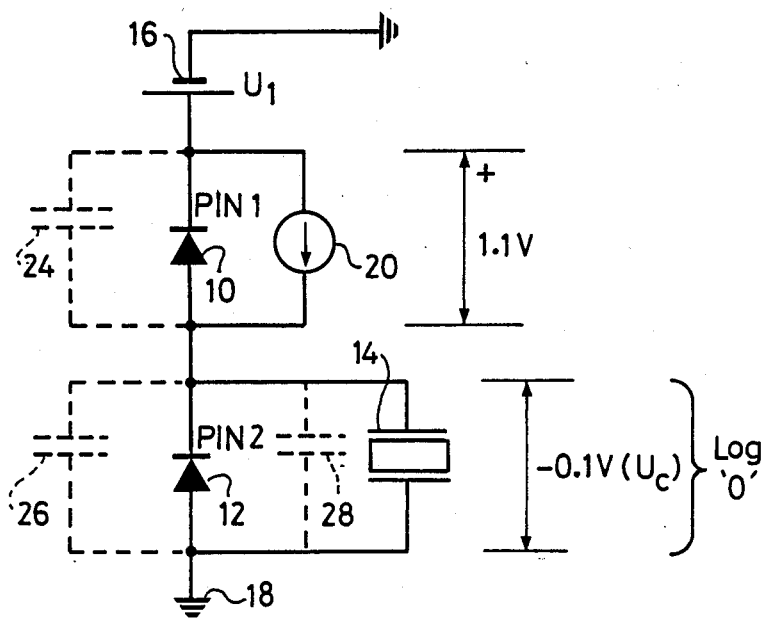
Figure 1C:
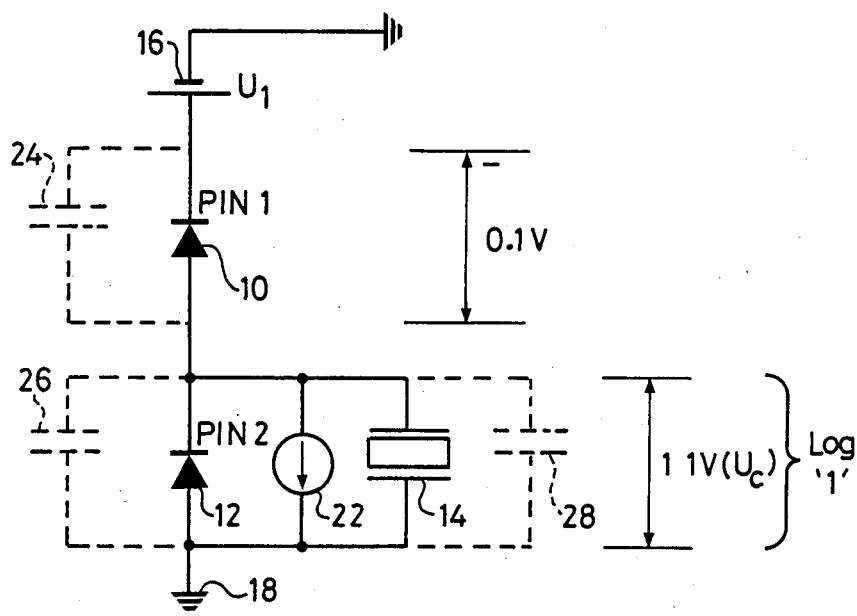
FIG. 1C shows the memory cell in the logical '1' condition.

For completeness FIG. 2 shows the equivalent electrical circuit diagram of the memory cell and which, in conjunction with FIGS. 1A, 1B and 1C, will assist understanding of the manner of electrical operation of the device. In FIGS. 1B and 1C, it is presumed that $U_1$ is equal to 1 volt.

When light is applied to PIN 1, photocurrent begins to flow (the current generator 31 in the equivalent circuit of FIG. 2, where 30, 32 indicate the dynamic resistances of the PINs). The magnitude of this current source is proportional to the radiant flux being detected by the photodiode. Of course, if the photodiode has a small forward bias the photocurrent will not flow (see current/voltage characteristic of FIG. 3A). This photocurrent will start to charge capacitors $C_1$, $C_2$, $C_0$ (24, 26, 28 in FIGS. 1A and 2) and therefore reverse bias across the first photodiode 10 will start to decrease while reverse bias across the second photodiode 12 will increase.

Figure 3A:
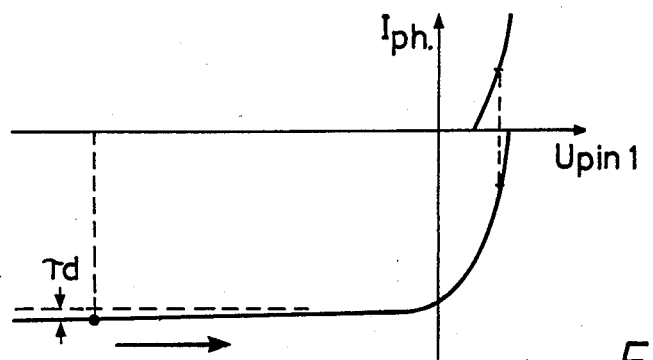
FIGS. 3A and 3B are characteristic curves for the photodiodes of the memory cell.
Figure 3B:
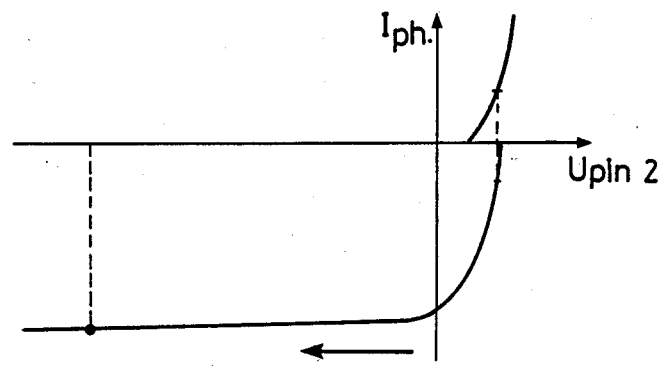
Figure 3B:
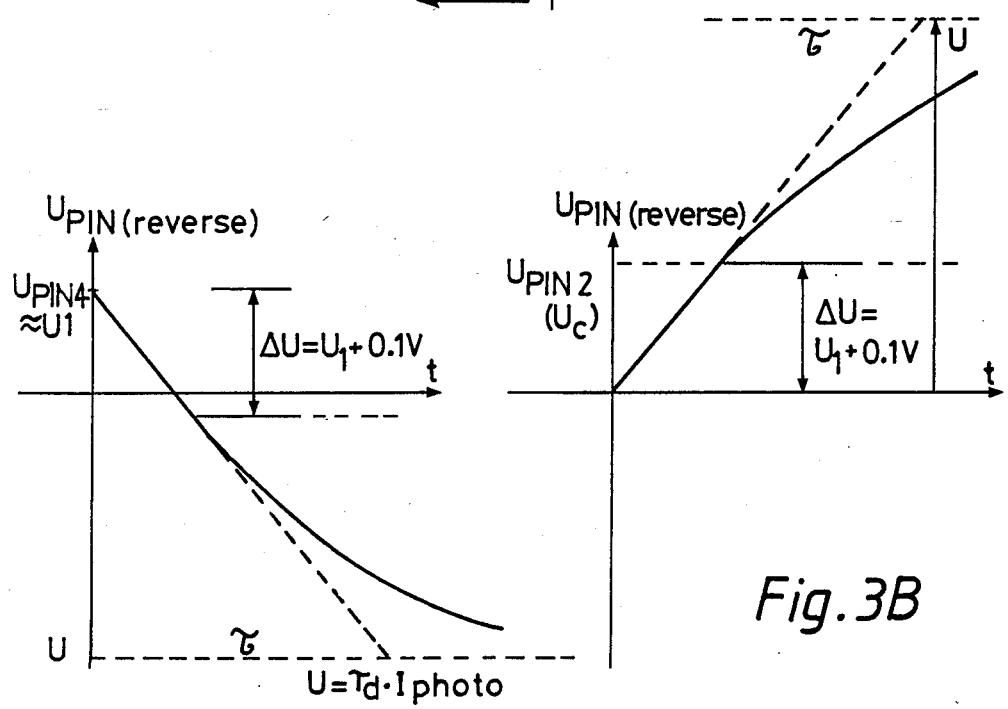

From FIG. 3A it is apparent that the photocurrent will slightly change as reverse bias is decreasing, until the diode operates in the reverse bias region, the reason for this being the large but finite dynamic resistance of the photodiode. For completeness, FIG. 3B shows how the voltages across PIN 1 and PIN 2 are changing.

From FIG. 3A it can be seen that the static operating point of PIN 1 is moving on the I/U characteristic to the right (towards $U_{PIN1}=0$) while the static operating point of PIN 2 is moving to the opposite side. This process will not end when PIN 1 reaches zero bias, because it operates under small forward bias also but with the rapidly decreasing photocurrent, but at small forward bias, dependent on diode type, the forward dark current becomes equal to the small reverse photocurrent. $C_2$ is now charged and PIN 2 (12) is operating under a condition of reverse bias, while PIN 1 (10) is "OFF", thus PIN 2 can only be discharged by applying light to PIN 2. In this case an analogous operation occurs, except that the photocurrent flows in the opposite direction (see FIG. 2, second current generator 33 in dashed line is now operating).

It will be understood that the memory cell access time thus in part depends on the magnitude of the biassing source $U_1$ (the position of the static operating point on the I/U characteristic), the capacities of the PINs and the optical switch, and the photocurrent (i.e. the applied light radiation). The presence or absence of charge on a capacitor ($C_1$ or $C_2$) is interpreted as a logical '1' or '0'. Because of the natural tendency to distribute itself into a lower energy-state configuration, and the dark current of PIN 2 (which tends to discharge $C_2$), the memory cell requires periodic charge refreshing to maintain data storage. Assuming that discharging of $C_{PIN2}$ is mainly due to the dark current of PIN 2 then the frequency for refreshing is readily determinable.

FIG. 1A shows the normal logical '0' condition, whilst FIGS. 1B and 1C illustrate temporary logical '0' and normal logical '1' situations, as will be made clear in the following description of the manner of writing into and reading from the memory cell.

When the memory cell is addressed, then two possibilities exist. One is that most of the voltage is on PIN 1 (logical '0' in which light cannot pass through the optical switch) and the second is the opposite in which most of the voltage is on PIN 2 and the optical switch (logical '1', in which light can pass through the optical switch).

Addressing a memory cell means that this particular cell is exposed to the incident light. The manner in which this is done is described later.

Given the situation shown in FIG. 1A, if PIN 1 is exposed to incident light then the photocurrent will flow through it and after a very short time the situation will change to that shown in FIG. 1C (logical '1'). If the situation is that shown in FIG. 1C and light is applied to PIN 1 then no action results because PIN 1 is not operable (see FIGS. 3A and 3B).

Considering the situation shown in FIG. 1C, but this time light being applied to PIN 2, which is operable, then it is apparent that the photocurrent will discharge both $C_2$ and $C_0$. The situation is now as shown in FIG. 1B. Thus, both FIGS. 1A and 1B represent a condition in which the memory has a logical '0' condition. In fact, FIGS. 1A and 1B represent two edge conditions of the same situation of logical '0'. This situation must exist until it is changed from the outside (by addressing/writing).

A logical '1' can be written in the memory cell by exposing PIN 1 to the incident light. If logical '1' is written and it is wished to write a logical '0' instead, then the light is applied to PIN 2 and after a very short time $U_c = -0.1V$ (see FIG. 1B). After that 1 dark on PIN 1 causes a very slow change of $U_c$ from $U_c = -0.1V$ to $U_c = +0.1V$ (FIG. 1A) but data logical '0' remains.

For reading, the optical switch of the memory cell is exposed to the incident light. The light can pass or not, depending upon a data stored in the cell. If light passes through the optical switch it is detected by a third photodiode PIN 3. Existence of a PIN 3 photocurrent represents a reading of logical '1'. Otherwise (no photocurrent on PIN 3) it is a logical '0'.

Figure 4:
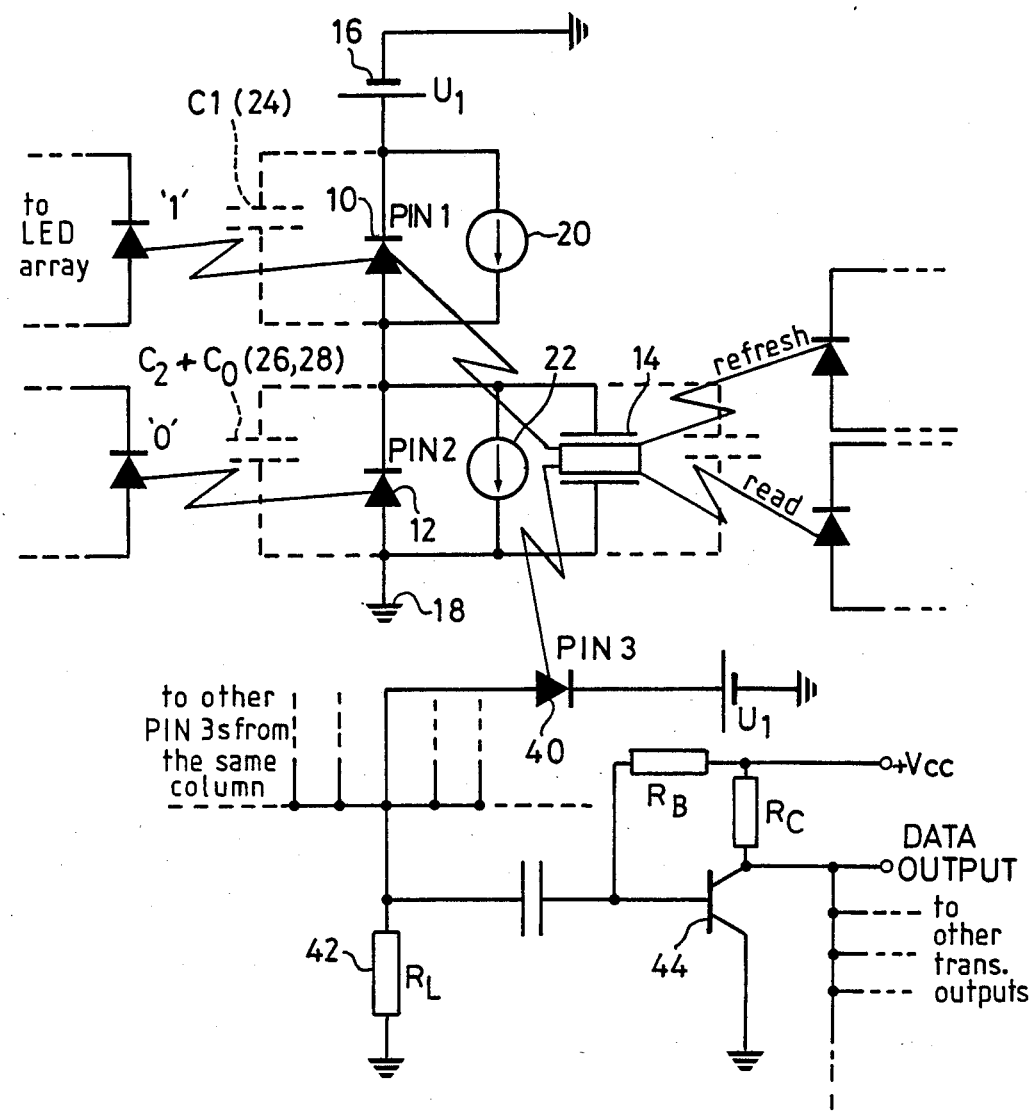
FIG. 4 shows a memory device incorporating the memory cell.

FIG. 4 shows the complete circuit incororating PIN 3, referenced 40. When photocurrent flows it causes the voltage drop across resistance $R_L$, referenced 42, the transistor 44 acting to amplify the signal. In fact, the transistor 44 acts as a preamplifier in a typical optoelectric receiver and it is followed by one or two amplifying stages. The receiver is not considered in detail because it is conventional in the art. The detector 40 is connected to all the photodiodes PIN 3 appertaining to all memory cells in one column of a complete memory device.

Refreshing is necessary when a logical '1' is stored in the memory cell, and refreshing is equivalent to periodic reading of one row of cells. During refreshing, all the optical switches of one row of memory cells are exposed to the light and if a logical '1' is stored the light can pass through that optical switch and be absorbed in the corresponding photodiode PIN 1. This action is also diagrammatically indicated in FIG. 4.

It is important to stress that refreshing does not interfere with reading the addressed memory cell. Refreshing can occur at the same time as reading is performed. However, no additional circuitry, such as arbiter for instance, is required (as in a conventional DRAM).

During refreshing, as above stated, if a logical '1' is stored light can pass through the optical switch and is absorbed in PIN 1 causing a photocurrent. This photocurrent is weak, because just a small quantity of the light can pass through the optical switch. The refreshing cycle time is calculated as the time which elapses for the fully charged capacitance ($C_2$ in parallel with $C_0$) to discharge, by leakage including dark current at PIN 2, to 90 percent of the full charge.

If the refreshing cycle time (time between two refreshing pulses) is equal to the time that passes after a logical '1' is stored, then the photocurrent at PIN 1 will charge $C_2 + C_0$ to full charge again (FIG. 4). If refreshing occurs just after logical '1' is stored then no refreshing is necessary and actually no refreshing will occur, because $C_2 + C_0$ is fully charged and PIN 1 is under a small forward bias (FIG. 1C) and photocurrent cannot flow nor charge $C_2 + C_0$. It is apparent that refreshing will always charge $C_2 + C_0$ to full charge but not more, because photocurrent causing the refresh operation stops when $C_2 + C_0$ is fully charged. Parasitic photocurrent at the optical switch is readily compensated in calculation of the refresh cycle time.

Figure 5A:
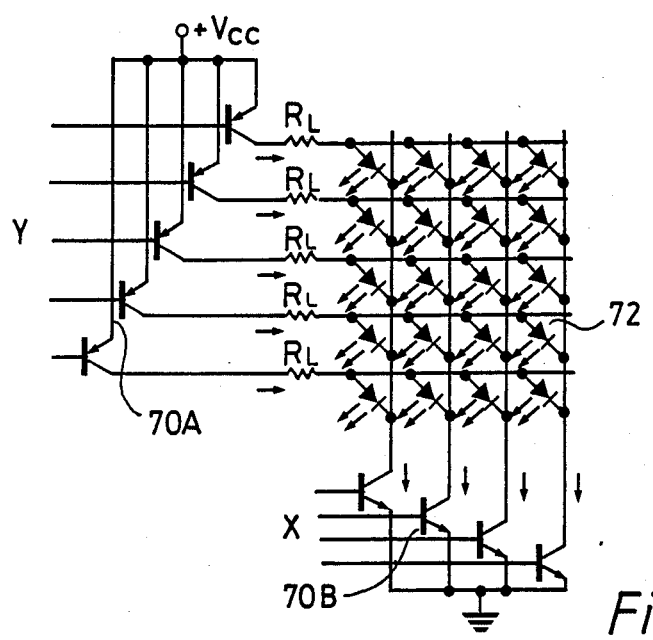
FIGS. 5A and 5B show x,y addressable LED arrays.

Addressing the memory cell may be performed by an x,y addressable LED array (see FIG. 5A). Instead of PNP and NPN bipolar transistors 70 FETs may be used as drivers for the LEDs 72. Alternatively, an LED array arranged as in FIG. 5B may be employed. Moreover, although there are other possibilities for addressing the memory, such as by optoelectronic means, the arrangements of FIGS. 5A and 5B are the simplest. FIG. 5C shows another possibility. LEDs 56 from one row are serially of PNP connected. Impulses from the y address decoder 58 drive these LEDs 56. The optical switches 60 from one column are connected in parallel. This possibility is acceptable only if high efficiency optical switches are employed (integrated optics). Employing an x,y addressable array for addressing (reading) gives one major advantage over a conventional DRAM, because when addressing the memory cell the input capacitance of one transistor only has to be loaded (see FIG. 5A) while in conventional DRAMs x capacitances have to be loaded. This advantage significantly improves the memory access time. Refreshing is separated from addressing (reading).

Figure 5D:
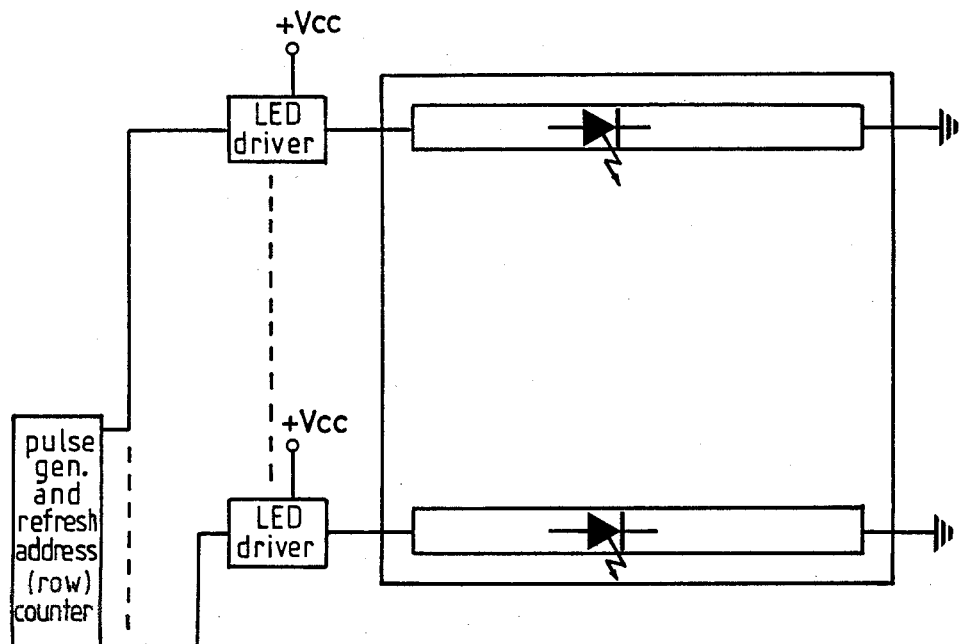
FIG. 5D shows a circuit for effecting refreshing.
Figure 5B:
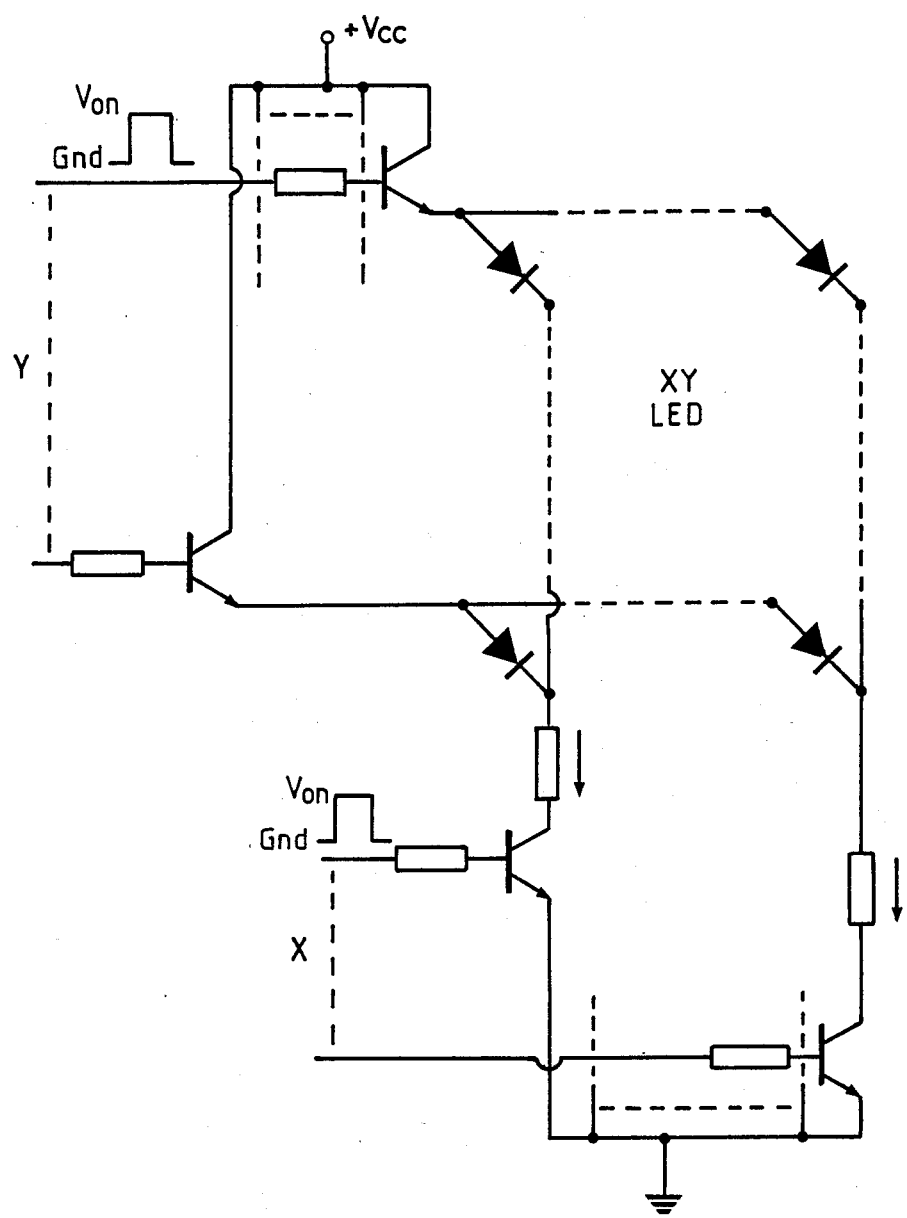
Figure 5C:
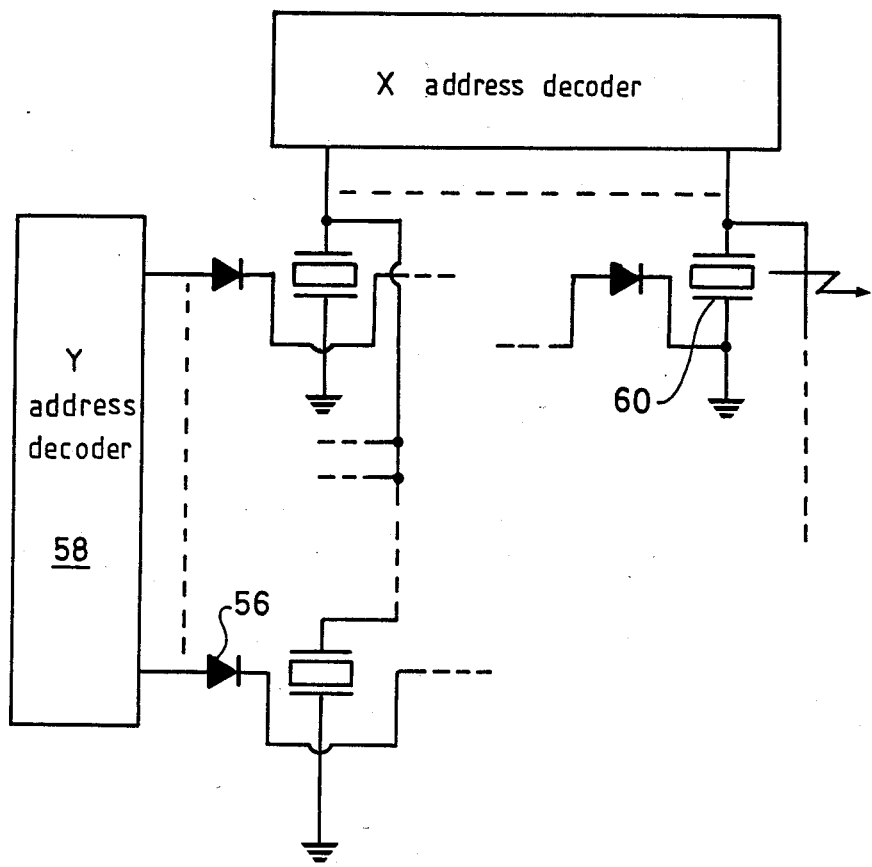
FIG. 5C shows an addressing circuit which obviates use of an LED array.

As can be seen from FIG. 5D, x LEDs (or x LED chains - each chain containing y serially connected LEDS, each LED for one memory cell in one row), each for one row, may be driven periodically with the refreshing generator pulses. Ordinarily, refreshing periodically refreshes row by row (or column by column), due to refreshing pulses from a pulse generator (which is completely independent of a microprocessor's clock) which may be integrated on the same chip as the memory, or alternatively refreshing pulses may be generated by a microprocessor.

In the LED array shown in FIG. 5A, the anode drivers are PNP transistors 70A and the cathode drivers 70B are NPN transistors. The arrangement of FIG. 5B avoids the requirement for a low active input for the anode drivers of FIG. 5A.

Figure 5E:
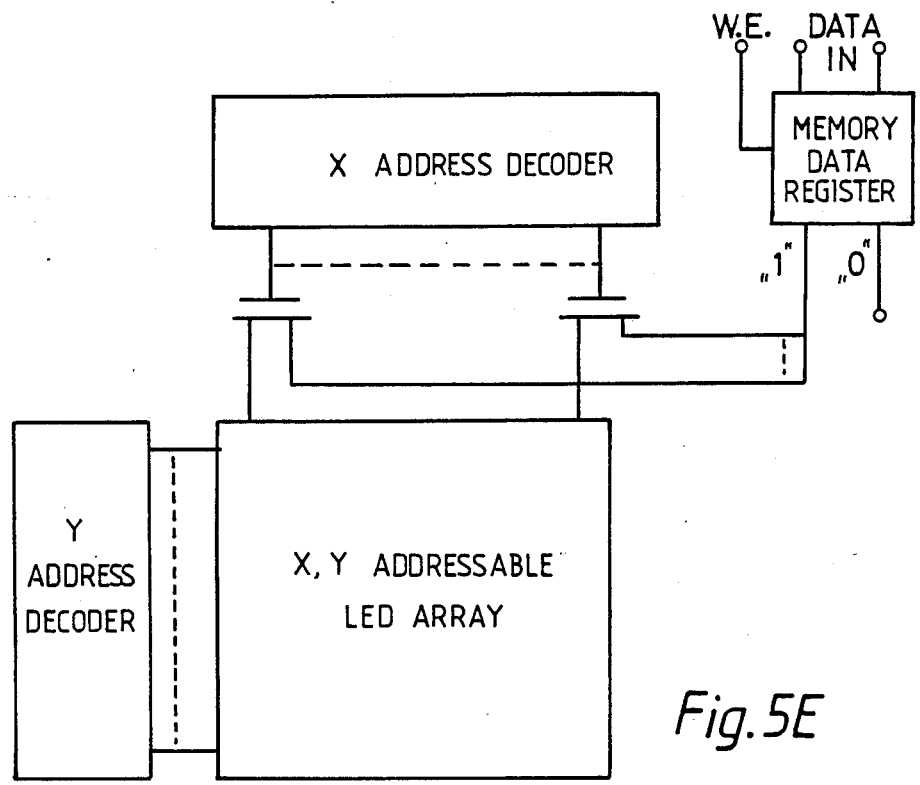
FIG. 5E shows an x,y addressable LED array for writing.

Writing in the memory cell can be performed by using two additional x,y addressable LED arrays. FIG. 5E shows a circuit which performs the act of writing logical '1' in an addressed cell. For writing a log. '0', the circuit is identical.

The LEDs in an LED array performing reading are optically coupled with the optical switches and photodetectors (PIN 3), as indicated diagrammatically in FIG. 4, and LEDs for writing are optically coupled with the photodiodes (PIN 1 and PIN 2), respectively. Refreshing LEDs are optically coupled with the optical switches and with PIN 1 photodiodes through these optical switches.

In considering the memory cell the terms "LEDs", "PINs" and "optical switches" have been employed. In fact, any type of light emitter (light emitting diodes, laser diodes) and detectors (photodiodes) can be used in construction of the device. The only difference that arises, from the use of different elements, is in physical fabrication of the device.

The optical switch is the key element in the memory cell structure. Two types of optical switches, both in themselves known, may be employed. One is a Ga-Al-As PIN junction light-waveguide modulator and the other is a silicon planar PN junction or MOS structure. Both are, in fact, optical modulators. Light-waveguide electro-optical modulators are known for use in integrated optic structures, with wavelengths in the near infrared part of the light spectrum. PN junction modulators, based on free carrier absorption (FCA), are commonly used as discrete elements, especially in the infrared part of the spectrum. Realisation of the device using PN or MOS optical switches is particularly preferred since silicon is used as a material (as well as Ga-As) for construction of such a hybrid device.

In describing the memory cell and its operation it was presumed that the optical switch is an ideal element, i.e. if it is under bias (logical '1') light can pass through it and if it is not under bias (logical '0') light cannot pass through it. However, it is difficult to obtain an ideal property in practice. A major advantage of the memory cell structure is that such a property (ideal light switching) is not necessary. This means that practically any type of light modulators can be used. Thus, turning again to FIG. 4, in the read operation, if logical '1' is stored in the memory cell, light can pass through the optical switch and it is then detected by PIN 3. If a logical '0' is stored, then light can also pass through but this time in a smaller quantity than if a logical '1' were stored. Thus, the amount of photocurrent at PIN 3 determines whether it is a logical '0' or '1'. The write operation is performed directly between LEDs and PIN 1s and PIN 2s, and optical coupling is not performed through the optical switch. Refreshing is performed through the optical switch, but in this case, when logical '1' is stored, light can pass through the optical switch and strike the surface of PIN 1 causing the refreshing photocurrent. The problem that arises when a logical '0' is stored is that the voltage is across $C_1$ and the photocurrent from PIN 1 tends to discharge it. Thus, when a logical '0' is stored, a refreshing photocurrent is unwanted, and may change the stored data (after few refreshing cycles). This problem is easily overcome if part of the LED diode performing refreshing is also optically coupled through the optical switch with PIN 1 and part of it, directly, with PIN 2. If logical '0' is stored and refreshing occurs, the photocurrent of PIN 1 will be compensated by the photocurrent of PIN 2. Of course, it is necessary that the same or appropriate amounts of light strike the surfaces of both PIN 1 and PIN 2.

If logical '1' is stored, then the amount of light striking the surface of PIN 2 is unchanged, but the amount of light passing through the optical switch and striking the surface of PIN 1 is now larger, thus causing the photocurrent from PIN 1 to be larger than the photocurrent from PIN 2. Refreshing occurs as a result.

Various possibilities exist for physical fabrication of the above described memory device and apparatus.

Thus, such a memory can be made as a hybrid device in which the device consists of three or possibly two monolithically integrated parts. In one arrangement, all LEDs are integrated out of Ga-As on the common substrate, whilst all photodiodes and transistors are integrated on the same silicon substrate. MOS SOS (metal oxide semiconductor silicon on sapphire) technology is alternatively possible, since MOS absorbents can be integrated on the sapphire substrate.

Ga-As and silicon parts are electrically isolated and optically coupled, due to the thin silicon dioxide film grown on the silicon part. This construction is similar to known integrated opto-isolators where a Ga-As part (LED) and an Si part (integrated photodiode and amplifier) are electrically isolated and optically coupled, with a transparent isolation medium.

It may also prove possible to integrate all silicon parts (absorbents and photodiodes) on the same silicon substrate. This may possibly be done with homoepitaxial growth of high resistivity (intrinsic) silicon on the silicon substrate, already carrying integrated photodiodes. This high resistivity silicon would then act as an electrical isolator between active silicon layers. Electrical connections between MOS absorbents and photodiodes may be made after etching holes in the insulating (intrinsic) layer. In fact this technology is at least equally acceptable in the case of Ga-As, since Ga-As exhibits greater resistivities. Alternatively, a wholly monolithic approach may be made, in which all the various components are generated in $Ga_xAl_{1-x}As/GaAs$ structure, which technique is well suited to mass production fabrication.

With regard to the monolithic integration of LEDs, x,y addressable LED arrays integrated on Ga-As substrates are already in use for microprocessor controlled displays. Heteroepitaxial growth of semiconductor films on oxide substrates is also rapidly developing technology, since there are no substrate capacitances between elements and the substrate, which acts as the insulator. This enables higher speed of responses and isolation between components is also better. Technologies also exist for integration of Ga-As active devices on oxide (sapphire among other) substrates. This technology has many advantages and it is therefore very attractive for application to the memory cell of this invention.

Yet again, the device may be quasimonolithically integrated in Ga-As and Si (side by side) on sapphire technology. In this case, planar optical switches (MOS absorbents) are replaced with light-waveguide switches (electro-optic modulators) and LEDs are replaced with laser diodes. Si photodiodes in this case detect light from the sides. This construction of device, although disadvantageous in some ways, has the major advantage of short memory access time. Optical switches commonly used in integrated optics are very efficient and there is no need for an optoelectronic receiver (which lengthens the device access). Also, laser diodes can be switched with higher frequencies than LEDS.

If low efficiency optical switches (MOS absorbents, based on FCA, for example) are employed, reading the memory cell requires an optoelectronic receiver with high gain and high speed. Optoelectronic receivers as are commonly used in various integrated opto-isolators and optical communication systems are suitable. All PIN 3s from memory cells in one column are connected in parallel. Thus, x optoelectronic receivers are needed when x is the number of columns in the memory.

Figure 6:
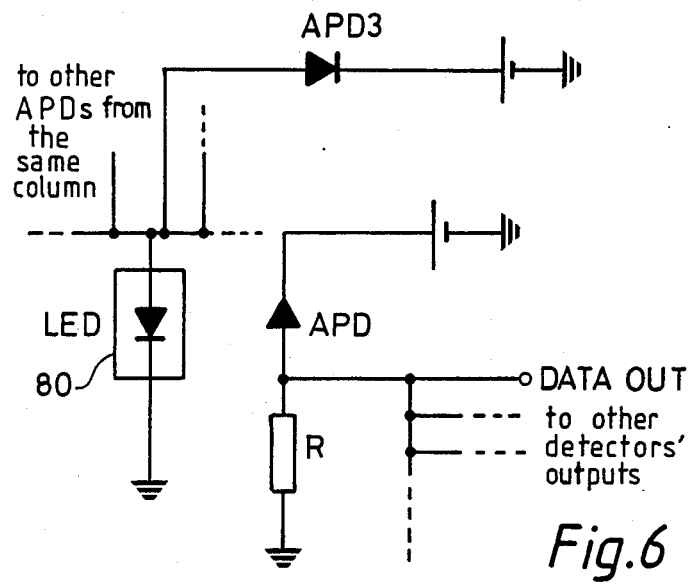
FIG. 6 shows an alternative output circuit.

All receiver outputs are connected in parallel (see FIG. 4). Thus, transistors' outputs are connected in parallel and, since the transistor output capacitance is much smaller than input capacitance, the total output capacitance is approximately equal to the input capacitance due to the Miller effect and the photodiodes (one column) capacitance. This is important for determining the receiver input and output time constants which in turn determine the receivers participation in access time. Regarding power dissipation, when the memory cell is addressed and the read operation is performed, two transistors (x,y LED drivers), one LED and x receivers are active, thus determining the power dissipation. It may be convenient to use silicon avalanche photodiodes (APDs) instead of PIN 3s. For the transistor amplifier, it is preferred to operate as a voltage than a current amplifier, subject to maintaining an adequate speed of response of the receiver. An access and cycle time of approx. 10 ns is preferred. In order to minimise power dissipation, it is possible to make only one receiver active. The addressing pulse (determining the column) may bias one receiver only (besides the proper LED driver). There is also a possibility, when APDs are used, to use a different approach, as will be understood from FIG. 6. In this case a receiver is not required. In the photodetector from FIG. 4, $R_L$ is replaced by an LED (80). Photocurrent from APD 3 (PIN 3) flows through the LED, causing a voltage drop across $R_{LED}$, through which $C_{APD}$ 3·y (y=number of rows) is charged. The time constant is unimportant since there is no amplifier as a load, and the additional optoelectronic conversion does not affect the access time.

Figure 7:
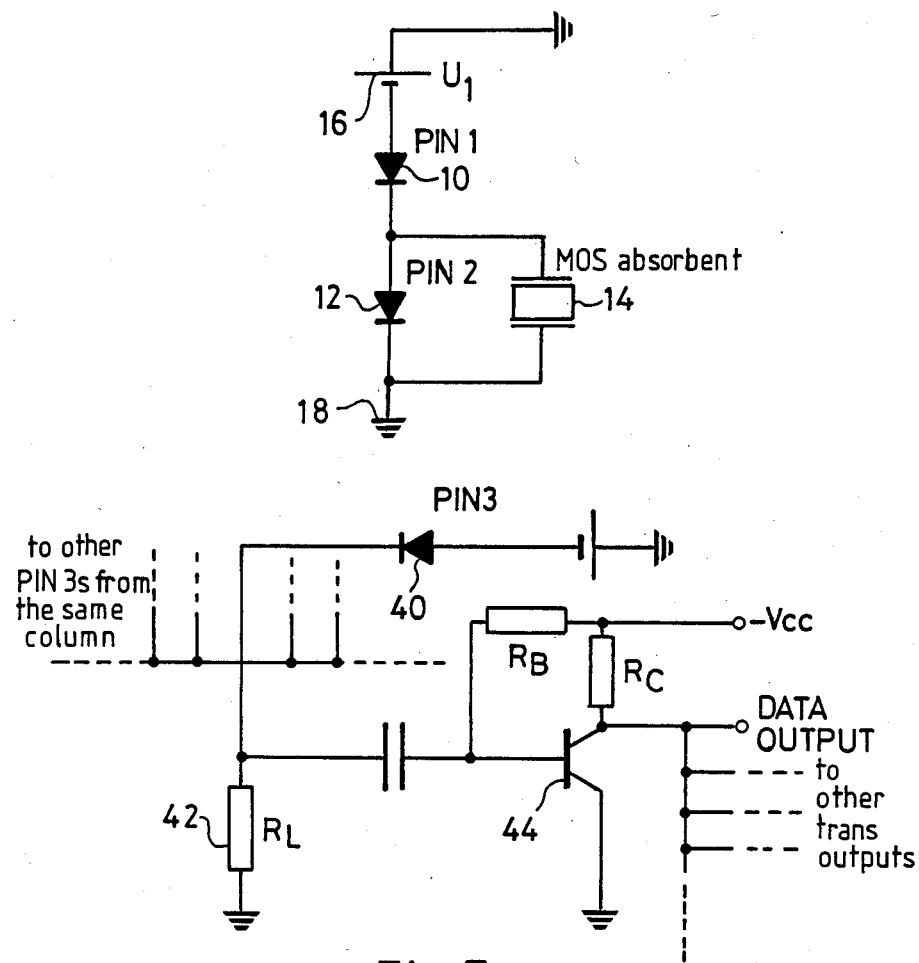
FIG. 7 shows a modified memory cell.

The above embodiments of the invention have been given by way of example only and various modifications thereof are possible within the spirit and scope of the invention, as will be readily apparent to those skilled in the art. For example, FIG. 7 shows an obvious modification of the basic memory cell clearly equivalent to that of FIGS. 1A to 1C.

Figure 8:
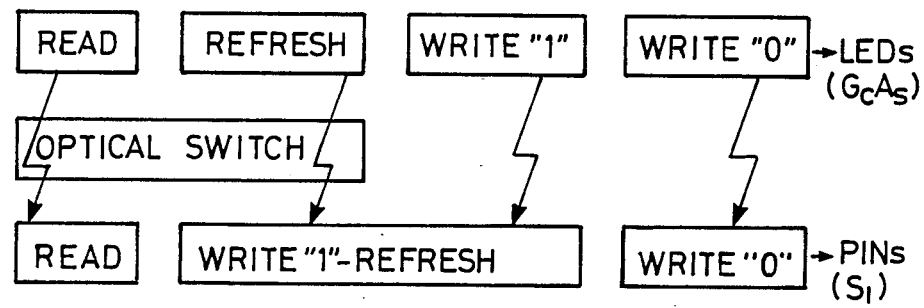
FIGS. 8 and 9 show diagrammatic cross-sections through the memory cell for explaining its manner of operation.
Figure 9:
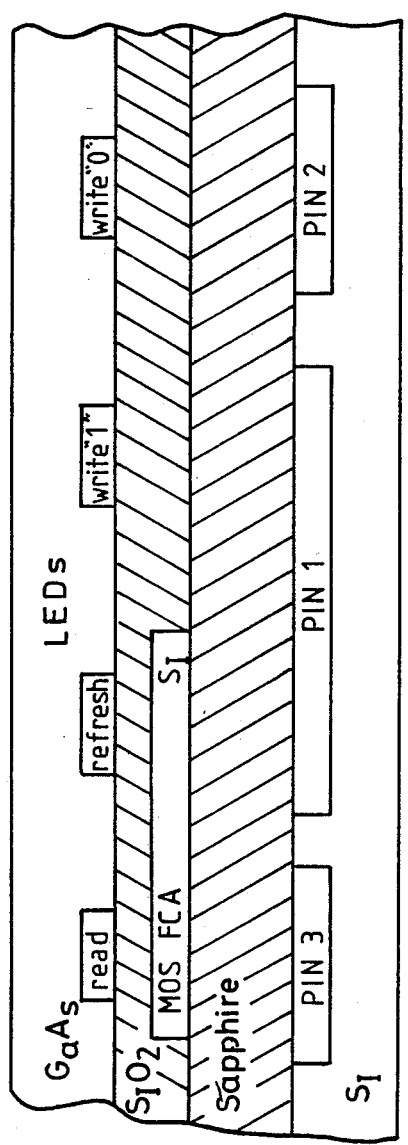

FIG. 8 is included to illustrate the manner of operation of the memory cell, when the cell is viewed in diagrammatic cross-section. FIG. 9 shows the structure in more detail, in the case of a hybrid device consisting of a sandwich structure of three integrated (two monolithically) parts. Optical coupling and optical isolation between logic functions are primarily achieved by virtue of the spatial arrangement. In this connection, it will be understood that the light pattern emanating from the GaAs LEDs is of the Lambertian type and only the correct photodiode (PIN) will be energised. The relatively large surfaces of the photodiodes (PINs) are also important. $SiO_2$ is optically transparent, and sapphire ($Al_2O_3$) is substantially transparent, whereby substantially all light absorption takes place in the optical switch (MOS FCA). Possible refraction problems can be overcome by etching holes in the $SiO_2$ and sapphire, for light transmission, if desired.

Figure 10:
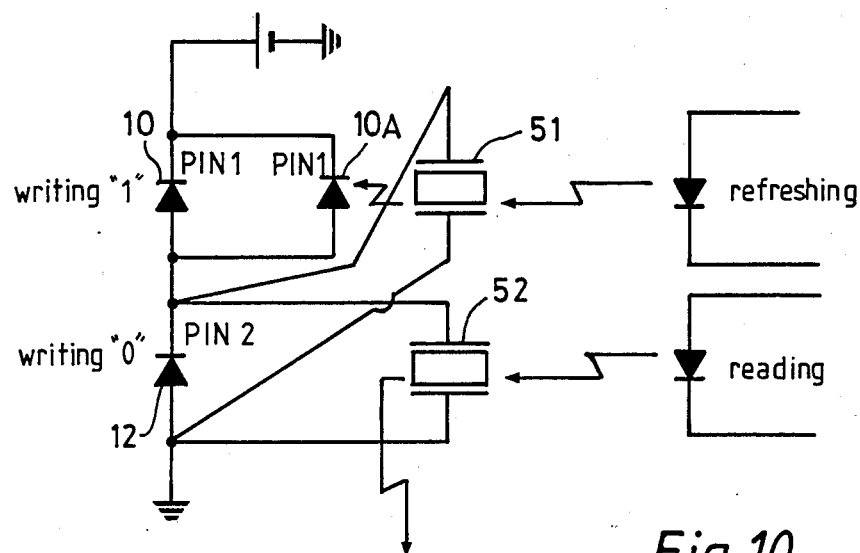
FIGS. 10 to 12 show respective modifications of the memory device.

In contrast, it will be appreciated that, in fully integrated electro-optics technology, the desired optical coupling and optical isolation are achieved in known manner by waveguiding between components disposed side by side. The only possible problem which arises is the use of the optical switch for both refreshing and reading, simultaneously. A solution to this problem is illustrated in FIG. 10, which employs two optical switches 51, 52 which are physically and optically separated but electrically connected in parallel so that, as with the additional photodiode 10A, the manner of operation is unchanged from that previously described. FIG. 10 is applicable to both integrated and hybrid structures of the device in accordance with the invention.

Figures 11, 12:
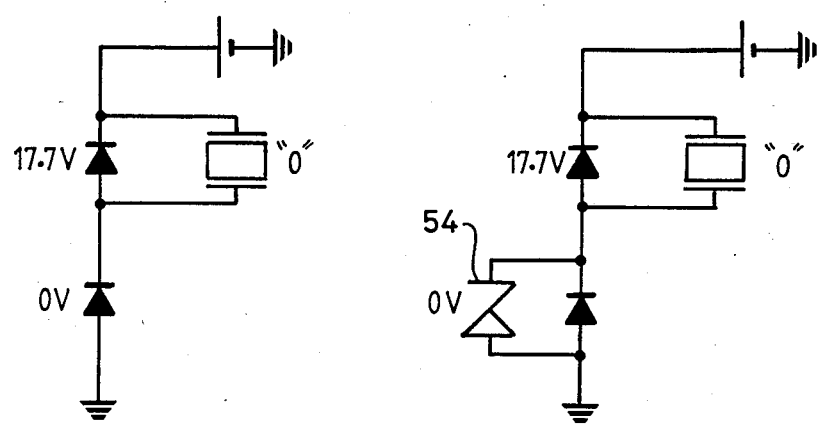

When, as hereinbefore mentioned, the optical switch is constituted by an electro-optic modulator, then a modulation depth of 70 percent is possible in either of two ways, respectively illustrated in FIGS. 11 and 12, of which the latter is preferred. The arrangement of FIG. 12 utilises two different Zener or avalanche breakdown diodes 54 of 5.4V breakdown voltage, each connected reversely in parallel with PIN1 and PIN2, enabling the controlling voltage to be varied between desired limits, as compared to 0V and $U_1V$ in the arrangement of FIG. 1.

In the aforedescribed examples, the use of a PH junction FCA modulator as the optical switch has generally been assumed, but this is not an essential characteristic of the invention.

PN FCA optical switches are planar structures with light applied perpendicularly on the PN junction (without waveguiding) which, in this application, employ both interband absorption (which is constant) and free carrier absorption (FCA) which is variable due to change in voltage applied on the PN junction and thus change in the depletion layer width. PN FCA optical switch, in this application, has a very small efficiency but this is irrelevant in this application (refreshing can be performed very frequently because it is independent of other operations and thus weak refreshing photocurrent is irrelevant).

MOS FCA structures are more desirable since there is no parasitic photocurrent (which is due to interband absorption), because of oxide between gate and a substrate.

I claim:

1. An optoelectronic dynamic random access memory device having a plurality of memory cells, each memory cell comprising a reversely biassed first photodiode, a second photodiode so connected electrically with the first photodiode as to become subject to an increasing reverse bias when the first photodiode is optically addressed to cause photocurrent to flow at said first photodiode to reduce the reverse bias of said first photodiode, whereupon when the second photodiode is optically addressed a flow of photocurrent at the second photodiode will decrease the reverse bias at the second diode and permit restoration of reverse bias at the first photodiode, thereby to define logical '0' and '1' states dependently on the reversals of reverse bias, a light-transmitting optical switch electrically connected in circuit with at least one of said first and second photodiodes and which when optically read passes light principally in only one of the '0' and '1' states defined by the first and second photodiodes, and means defining an optical coupling between the optical switch and one of said first and second diodes, whereby the memory cell is optically refreshable in one of the two states without precluding reading by cyclically causing a light to pass at the optical switch and thereby be incident on said one of the first and second photodiodes to restore reverse bias lost at the other of said photodiodes due to decay.

2. The device of claim 1 wherein in each memory cell the first photodiode is reversely biassed at one of its electrodes and the other electrode of said first photodiode is connected to the corresponding first electrode of the second photodiode, said second photodiode being earthed at its other electrode, and the optical switch is connected in parallel with one of said first and second photodiodes.

3. The device of claim 1, wherein the optical switch is one of a PN structure and a MOS structure and PIN structure constituting an optical modulator.

4. The device of claim 1, wherein refreshing is effected by directing light on to the optical switch in the logical '1' condition so that light emanating from the optical switch is incident on at least the first photodiode.

5. An optoelectronic dynamic random access memory device having a plurality of memory cells, each memory cell comprising a reversely biassed first diode; an earthed second photodiode electrically connected to the first photodiode firstly to become reversely biassed when photocurrent flows at the first photodiode and secondly to permit restoration of reverse bias at the first photodiode when photocurrent flows at the second photodiode; means for optically addressing the photodiodes to cause switching between logical '0' and '1' states dependently on the conditions of reverse bias; an optical switch electrically connected in parallel with one of the first and second photodiodes, said optical switch permitting passage of light in one of the '0' and '1' states to enable optical reading; and means supporting the photodiodes and the optical switch to optically couple said optical switch and at least one of the said photodiodes thereby to enable refreshing in one of the '0' and '1' states by permitting light to pass through the optical switch to be incident on at least the first photodiode.

6. Optoelectronic dynamic random access memory apparatus comprising:

a plurality of memory cells, each memory cell comprising first and second photodiodes and an optical switch;

means for reversely biassing the first photodiode, the second photodiode being connected to the first photodiode for exchanging conditions of reverse bias therewith when photocurrent flows at one of said first and second photodiodes;

means for optically addressing the first and second photodiodes to write a '0' or '1' logical state dependently on the condition of reverse bias;

an optical switch electrically connected to at least one of the first and second photodiodes;

means for optically reading the memory cell by directing light on to the optical switch, which principally transmits light in only one of the '0' and '1' states;

a photodetector;

means supporting the photodiodes, optical switch and photodetector so that light for reading the memory cell and passed through the optical switch is at least principally incident on the photodetector and does not energise the photodiodes.

7. The apparatus of claim 6 including means for refreshing the memory cell in one of the '0' and '1' states by directing light on to the optical switch for passage of light which is incident on at least the first photodiode and does not energise the photodetector.

8. The apparatus of claim 7 wherein the optical switch is one of a PN structure and a MOS structure and PIN structure constituting an optical modulator.

9. The apparatus of claim 7 including an electronic receiver connected to be responsive to the outputs of the photodetectors associated with the memory cells of a column thereof.

10. The apparatus of claim 7 wherein at least one of the functions of writing into and reading the memory cells is performed by an x,y addressable LED array.

* * * * *